US 8,642,476 B2

(12) United States Patent
Itoh et al.

(10) Patent No.: US 8,642,476 B2
(45) Date of Patent: Feb. 4, 2014

(54) METHOD FOR MANUFACTURING SILICON CARBIDE SEMICONDUCTOR DEVICE (75) Inventors: Satomi Itoh, Osaka (JP); Hiromu Shiomi, Osaka (JP); Yasuo Namikawa, Itami (JP); Keiji Wada, Osaka (JP); Mitsuru Shimazu, Osaka (JP); Toru Hiyoshi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 13 days.

(21) Appl. No.: 13/502,991

(22) PCT Filed: Feb. 25, 2011

(86) PCT No.: PCT/JP2011/054333
§ 371 (c)(1),
(2), (4) Date: Apr. 19, 2012

(87) PCT Pub. No.: WO2011/158534
PCT Pub. Date: Dec. 22, 2011

(65) Prior Publication Data
US 2012/0208302 A1  Aug. 16, 2012

(30) Foreign Application Priority Data
Jun. 16, 2010  (JP) ................ 2010-136872

(51) Int. Cl.
*H01L 21/302*  (2006.01)

(52) U.S. Cl.
USPC ............ 438/704; 438/705; 438/723; 438/743

(58) Field of Classification Search
USPC .................. 438/704, 705, 723, 743
See application file for complete search history.

(56) References Cited

U.S. PATENT DOCUMENTS

| 5,272,107 | A | | 12/1993 | Suzuki et al. | |
| 5,459,107 | A | | 10/1995 | Palmour | |
| 5,840,610 | A | * | 11/1998 | Gilmer et al. | 438/301 |
| 6,136,727 | A | | 10/2000 | Ueno | |
| 2001/0006836 | A1 | | 7/2001 | Nakamura et al. | |
| 2003/0203573 | A1 | | 10/2003 | Nakamura et al. | |
| 2006/0194379 | A1 | * | 8/2006 | Suda et al. | 438/197 |
| 2007/0015333 | A1 | | 1/2007 | Kishimoto et al. | |
| 2007/0207596 | A1 | * | 9/2007 | Kim et al. | 438/478 |
| 2010/0025695 | A1 | * | 2/2010 | Shibagaki et al. | 257/77 |

FOREIGN PATENT DOCUMENTS

| CA | 2 779 426 A1 | 12/2011 |
| JP | 60-066866 | 4/1985 |
| JP | 7-066192 | 3/1995 |
| JP | 7-263692 | 10/1995 |
| JP | 8-051110 | 2/1996 |
| JP | 10-125904 | 5/1998 |
| JP | 11-186256 | 7/1999 |

(Continued)

*Primary Examiner* — Binh X Tran
(74) *Attorney, Agent, or Firm* — Venable LLP; Michael A. Sartori (57) ABSTRACT There is provided a method for manufacturing a SiC semiconductor device achieving improved performance. The method for manufacturing the SiC semiconductor device includes the following steps. That is, a SiC semiconductor is prepared which has a first surface having at least a portion into which impurities are implanted. By cleaning the first surface of the SiC semiconductor, a second surface is formed. On the second surface, a Si-containing film is formed. By oxidizing the Si-containing film, an oxide film constituting the SiC semiconductor device is formed.

4 Claims, 6 Drawing Sheets (56) References Cited

FOREIGN PATENT DOCUMENTS

| | | |
|---|---|---|
| JP | 2000-353670 | 12/2000 |
| JP | 2002-270837 | 9/2002 |
| JP | 2006-128479 | 5/2006 |
| JP | 2006-351744 | 12/2006 |
| JP | 2008-098200 | 4/2008 |
| JP | 2008-218770 | 9/2008 |
| JP | 2008-288482 | 11/2008 |
| JP | 2008-294204 | 12/2008 |
| JP | 2012-004269 | 1/2012 |

\* cited by examiner

METHOD FOR MANUFACTURING SILICON CARBIDE SEMICONDUCTOR DEVICE

TECHNICAL FIELD

The present invention relates to a method for manufacturing a silicon carbide (SiC) semiconductor device, more particularly, a method for manufacturing a SiC semiconductor device having an oxide film.

BACKGROUND ART

SiC has a large band gap and has larger maximum dielectric breakdown electric field and thermal conductivity than those of silicon (Si). Moreover, SiC has a carrier mobility as large as that of silicon, and has large electron saturation drift velocity and large breakdown voltage. Accordingly, it is expected to apply SiC to a semiconductor device required to achieve high efficiency, high voltage, and large capacity. An exemplary method for manufacturing such a SiC semiconductor device is a technique disclosed in Japanese Patent Laying-Open No. 2008-294204 (Patent Literature 1).

Patent Literature 1 discloses that in a method for manufacturing a MOSFET (Metal Oxide Semiconductor Field Effect Transistor) serving as a SiC semiconductor device, thermal oxidation of approximately 1000° C. is performed in each of an ion implantation step performed before forming a gate oxide film; a sacrificial oxidation and sacrificial oxide film removing step of removing surface roughness resulting from activation heating treatment; and a gate oxide film forming step. It is also disclosed that in performing the thermal oxidation in each of the sacrificial oxidation and sacrificial oxide film removing step and the gate oxide film forming step, rate of the thermal oxidation greatly differs between a region having an impurity implanted therein and a region having no impurity implanted therein.

Figure 13:
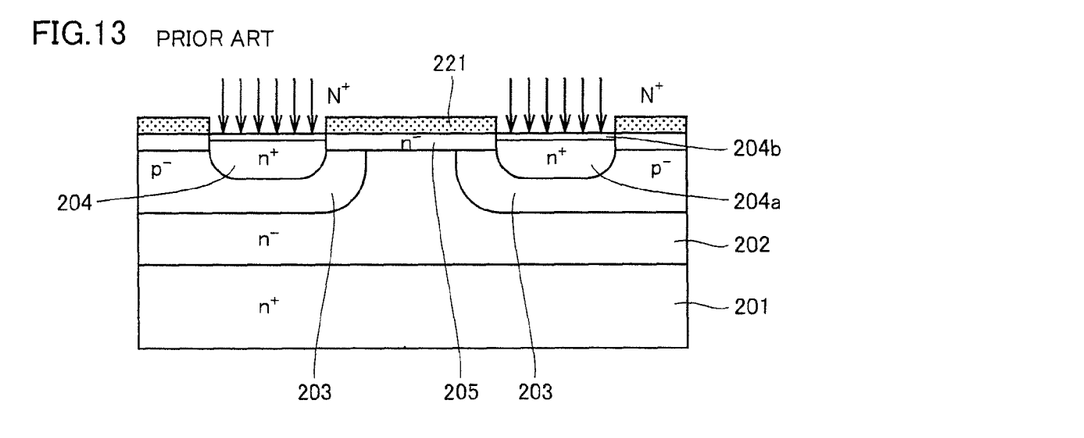
FIG. 13 is a cross sectional view showing a step in manufacturing a MOSFET of Patent Literature 1.
Figure 14:
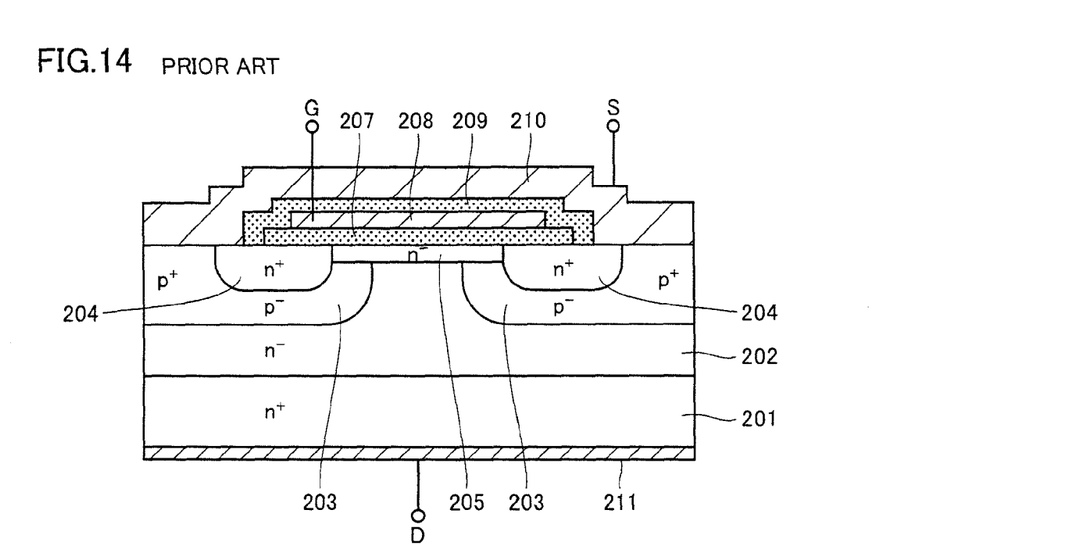
FIG. 14 is a cross sectional view showing a step in manufacturing the MOSFET of Patent Literature 1.

In Patent Literature 1, in view of the problem, the following method for manufacturing a MOSFET is disclosed. FIG. 13 and FIG. 14 are cross sectional views showing steps in manufacturing the MOSFET in Patent Literature 1. As shown in FIG. 13, an n⁻ epitaxial layer 202 is epitaxially grown on a SiC substrate 201. Ions are implanted into this n⁻ epitaxial layer 202 to form p⁻ base regions 203. On n⁻ epitaxial layer 202 thus including p⁻ base regions 203, an n⁻ channel layer 205 is epitaxially grown. Thereafter, ion implantation is performed using an LTO film 221 as a mask to form n⁺ source regions 204. On this occasion, each of n⁺ source regions 204 is formed to have a region 204$a$ and a region 204$b$ containing an n type impurity at a concentration lower than that of region 204$a$. In thermal oxidation for forming a gate oxide film 207 (see FIG. 14) in a subsequent step, region 204$b$ will be oxidized whereas region 204$a$ will not be oxidized and will remain as n⁺ source region 204. Thereafter, activation heating treatment is performed. Next, as shown in FIG. 14, LTO film 221 is removed, thus forming gate oxide film 207 on the surface of the epitaxial layer. Then, on gate oxide film 207, a gate electrode 208 is formed. Further, an insulating film 209 is formed, and a source electrode 210 and a drain electrode 211 are formed.

CITATION LIST

Patent Literature

PTL 1: Japanese Patent Laying-Open No. 2008-294204

SUMMARY OF INVENTION

Technical Problem

In Patent Literature 1, in the surface of the epitaxial layer, p⁻ base regions 203, n⁺ source regions 204, and n⁻ channel layer 205 are formed. When the surface of the epitaxial layer is oxidized to form the gate oxide film, the regions having the impurities (dopants) of different types and different concentrations are oxidized all at once. In this case, oxidizing rate differs due to the types and concentrations of the impurities, whereby film quality can differ in the gate oxide film. Patent Literature 1 describes that it is considered to restrain increase of the speed of oxidation in n⁺ source regions 204. However, a portion of gate oxide film 207 on a region (n⁻ channel layer 205) other than n⁺ source regions 204 and portions of gate oxide film 207 on n⁺ source regions 204 are different from each other in terms of conditions of the surface therebelow. This may result in varied film quality. When the film quality of gate oxide film 207 is varied, performance of the MOSFET will be deteriorated.

In view of this, the present invention has its object to provide a method for manufacturing a SiC semiconductor device achieving improved performance.

Solution to Problem

A method for manufacturing a SiC semiconductor device in the present invention includes the following steps. That is, a SiC semiconductor is prepared which includes a first surface having at least a portion into which an impurity (dopant) is implanted. A second surface thereof is formed by cleaning the first surface of the silicon carbide semiconductor. A silicon (Si)-containing film is formed on the second surface. An oxide film constituting the silicon carbide semiconductor device is formed by oxidizing the Si-containing film.

According to the method for manufacturing the SiC semiconductor device in the present invention, the Si-containing film is formed on the second surface formed by cleaning the first surface of the SiC semiconductor. Accordingly, the Si-containing film can be clean, and influence of the second surface can be reduced over the film quality of the Si-containing film. This leads to improved uniformity of the film quality of the Si-containing film. By oxidizing the Si-containing film thus having improved uniformity of the film quality, variation in oxidizing rate can be reduced in the depth direction at each location in the Si-containing film. Also, variation can be reduced in film quality of the oxide film obtained by oxidizing the Si-containing film having improved uniformity of the film quality. Thus, the quality of the oxide film constituting the SiC semiconductor device can be improved, thereby improving performance of the SiC semiconductor device.

Preferably in the method for manufacturing the SiC semiconductor device, the Si-containing film is a SiC film. Accordingly, the Si-containing film has the same crystal as that of the SiC semiconductor lying therebelow, thereby facilitating formation of the Si-containing film.

Preferably in the method for manufacturing the SiC semiconductor device, the Si-containing film is a Si film. Accordingly, carbon (C) can be restrained from existing in an interface between the SiC semiconductor layer and the oxide film and in the oxide film. This leads to more improved performance of the SiC semiconductor device to be manufactured.

Preferably in the method for manufacturing the SiC semiconductor device, the step of forming the Si-containing film includes the steps of: determining a thickness of the oxide film constituting the silicon carbide semiconductor device; and controlling a thickness of the Si-containing film to be the determined thickness of the oxide film when the Si-containing film is entirely oxidized.

Accordingly, the oxide film can be formed to have a desired thickness by controlling the thickness of the Si-containing film. Further, by entirely oxidizing the Si-containing film into the oxide film, there can be formed an oxide film allowing for reduced content of the impurities implanted into the first surface thereof.

Advantageous Effects of Invention

According to the method for manufacturing the SiC semiconductor device in the present invention, the oxide film constituting the SiC semiconductor device is formed by oxidizing the Si-containing film. Accordingly, a SiC semiconductor device achieving improved performance can be manufactured.

DESCRIPTION OF EMBODIMENTS

The following describes an embodiment of the present invention with reference to figures. It should be noted that in the below-mentioned figures, the same or corresponding portions are given the same reference characters and are not described repeatedly.

Figure 1:
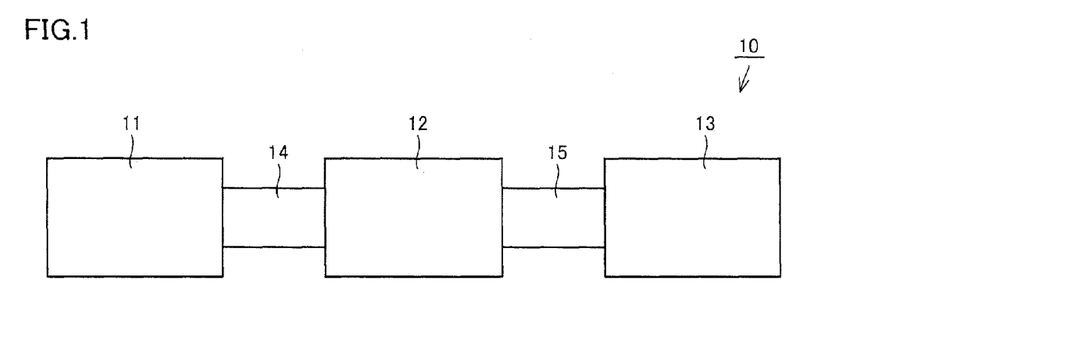
FIG. 1 is a schematic view of a manufacturing device for manufacturing a SiC semiconductor device in an embodiment of the present invention.

FIG. 1 is a schematic view of a manufacturing device 10 for manufacturing a SiC semiconductor device in an embodiment of the present invention. Referring to FIG. 1, manufacturing device 10 for manufacturing a SiC semiconductor device in one embodiment of the present invention will be described.

As shown in FIG. 1, manufacturing device 10 for manufacturing a SiC semiconductor device includes a cleaning unit 11, a first forming unit 12, a second forming unit 13, a first connection portion 14, and a second connection portion 15. Cleaning unit 11 and first forming unit 12 are connected to each other by first connection portion 14. Each of cleaning unit 11, first forming unit 12, and first connection portion 14 has an internal portion isolated from atmospheric air. The internal portions thereof can communicate with each other. First forming unit 12 and second forming unit 13 are connected to each other by second connection portion 15. Each of first forming unit 12, second forming unit 13, and second connection portion 15 has an internal portion isolated from atmospheric air. The internal portions thereof can communicate with each other.

Cleaning unit 11 cleans a SiC semiconductor's first surface having at least a portion into which an impurity is implanted, thereby forming a second surface thereof. For cleaning unit 11, it is preferable to use, for example, an H etching device for dry-etching (hereinafter, also referred to as "H etching") the first surface using a gas containing hydrogen gas ($H_2$). As the H etching device, for example, a high-frequency heating furnace or the like can be used.

Cleaning unit 11 is not particularly limited to the H etching device, and may be a device for forming an oxide film on the first surface of the SiC semiconductor and removing the oxide film for the purpose of cleaning. In this case, the same device or different devices may be employed to form the oxide film and remove the oxide film. In the case where different devices are employed to form the oxide film and remove the oxide film, it is preferable to further provide a connection portion isolated from atmospheric air and connecting them to each other such that the SiC semiconductor can be transported therethrough.

First forming unit 12 forms a Si-containing film on the second surface. For first forming unit 12, a CVD (Chemical Vapor Deposition) device is used, for example.

Second forming unit 13 forms an oxide film constituting the SiC semiconductor device, by oxidizing the Si-containing film. Second forming unit 13 can employ, for example, a dry oxidation (thermal oxidation) device, or a wet oxidation device for heating in an oxygen environment containing water vapor. It is preferable to employ the dry oxidation device.

First connection portion 14 connects cleaning unit 11 and first forming unit 12 to each other such that the SiC semiconductor can be transported therethrough. A region (internal space) of first connection portion 14 through which an epitaxial wafer 100 is transported can be isolated from atmospheric air.

Second connection portion 15 connects first forming unit 12 and second forming unit 13 to each other such that the SiC semiconductor having the Si-containing film formed thereon can be transported therethrough. A region (internal space) of second connection portion 15 through which epitaxial wafer 100 is transported can be isolated from atmospheric air.

Here, the phrase "isolated from atmospheric air (atmosphere isolated from atmospheric air)" refers to an atmosphere in which atmospheric air is not mixed. An example thereof includes: an atmosphere including at least one of nitrogen gas, hydrogen gas, and inert gas; or vacuum. Specifically, the example of the atmosphere isolated from atmospheric air includes: an atmosphere filled with a gas containing nitrogen (N), hydrogen (H), helium (He), neon (Ne), argon (Ar), krypton (Kr), xenon (Xe), radon (Rn), or combination thereof; or vacuum.

First connection portion 14 connects the internal portion of cleaning unit 11 and the internal portion of first forming unit 12 to each other. First connection portion 14 has the internal space for transporting, to first forming unit 12, the SiC semiconductor transported from cleaning unit 11. Namely, first connection portion 14 is provided to transport the SiC semiconductor from cleaning unit 11 to first forming unit 12 so as not to expose the SiC semiconductor to the atmospheric air.

Second connection portion 15 connects the internal portion of first forming unit 12 and the internal portion of second forming unit 13 to each other. Second connection portion 15 has the internal space for transporting, to second forming unit 13, the SiC semiconductor transported from first forming unit 12. Namely, second connection portion 15 is provided to transport the SiC semiconductor from first forming unit 12 to second forming unit 13 so as not to expose the SiC semiconductor to the atmospheric air.

First and second connection portions 14, 15 have sizes such that a SiC semiconductor can be transported therein. In addition, first and second connection portions 14, 15 may have sizes such that a SiC semiconductor placed on a susceptor can be transported therein.

First connection portion 14 is, for example, a load lock chamber for connecting the exit of cleaning unit 11 and the entrance of first forming unit 12 to each other. Second connection portion 15 is, for example, a load lock chamber for connecting the exit of first forming unit 12 and the entrance of second forming unit 13 to each other.

Further, manufacturing device 10 may further include a first transporting unit, provided in first connection portion 14, for transporting the SiC semiconductor from cleaning unit 11 to first forming unit 12. Manufacturing device 10 may further include a second transporting unit, provided in second connection portion 15, for transporting the SiC semiconductor from first forming unit 12 to second forming unit 13. The first transporting unit and the second transporting unit may be the same unit or different units.

Further, manufacturing device 10 may further include a first isolating unit, provided in first connection portion 14, for isolating the internal portion of cleaning unit 11 and the internal portion of first forming unit 12 from each other. Further, manufacturing device 10 may further include a second isolating unit, provided in second connection portion 15, for isolating the internal portion of first forming unit 12 and the internal portion of second forming unit 13 to each other. For each of the first and second isolating units, for example, there may be employed a valve or door capable of closing each of the communicating portions. A plurality of valves or doors may be provided.

Further, manufacturing device 10 may include a vacuum pump for discharging atmospheric gas from inside manufacturing device 10, or a replacement gas container for replacing the atmospheric gas in manufacturing device 10. The vacuum pump or the replacement gas container may be connected to each of or at least one of cleaning unit 11, first forming unit 12, second forming unit 13, first connection portion 14, and second connection portion 15.

It should be noted that manufacturing device 10 may include various elements other than those described above, but for ease of description, these elements are not described and not shown in figures.

It should be also noted that FIG. 1 shows the form in which first connection portion 14 only connects between cleaning unit 11 and first forming unit 12 and second connection portion 15 only connects between first forming unit 12 and second forming unit 13. However, the present invention is not particularly limited to this. For example, as first and second connection portions 14, 15, a chamber isolated from atmospheric air is employed to accommodate cleaning unit 11, first forming unit 12, and second forming unit 13 therein.

Figure 2:
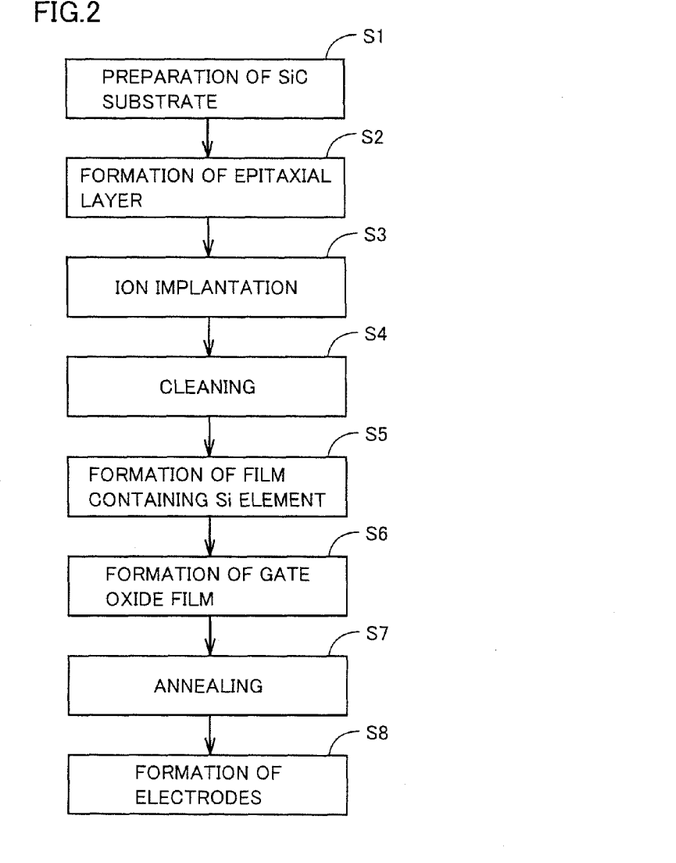
FIG. 2 is a flowchart showing a method for manufacturing the SiC semiconductor device in the embodiment of the present invention.
Figure 7:
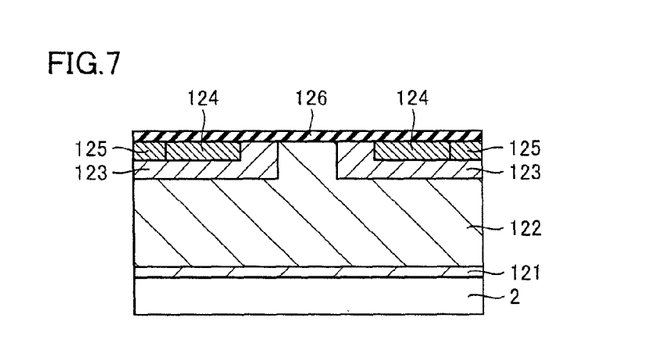
FIG. 7 is a cross sectional view schematically showing a step in manufacturing the SiC semiconductor device in the embodiment of the present invention.
Figure 8:
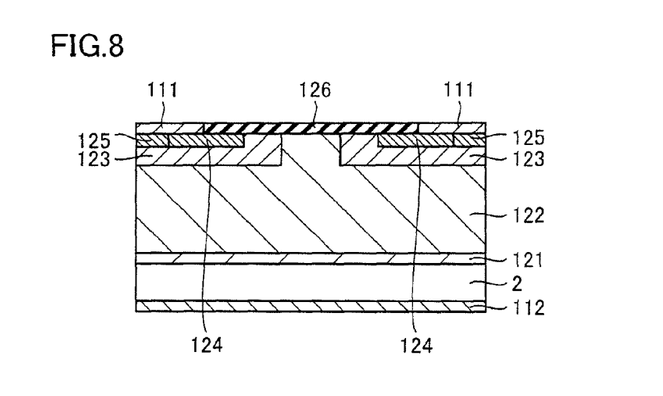
FIG. 8 is a cross sectional view schematically showing a step in manufacturing the SiC semiconductor device in the embodiment of the present invention.
Figure 9:
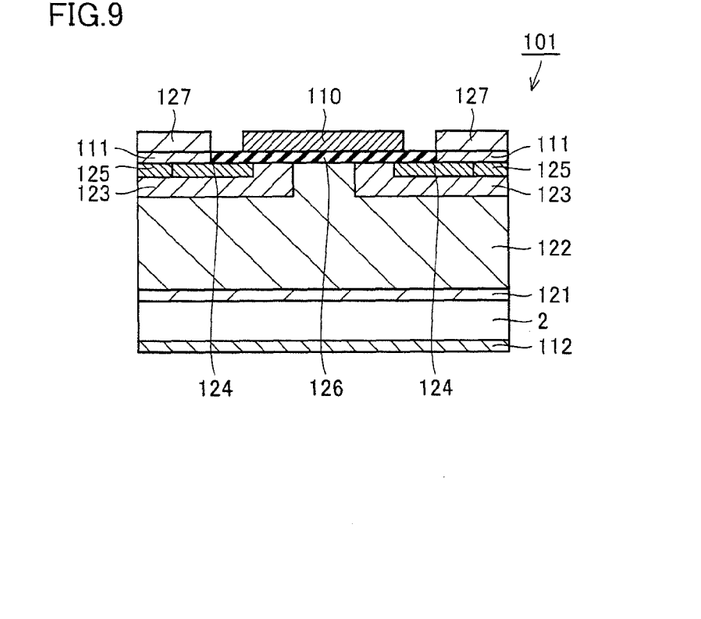
FIG. 9 is a cross sectional view schematically showing the SiC semiconductor device manufactured in the embodiment of the present invention.

Referring to FIG. 1 to FIG. 9, the following describes a method for manufacturing a SiC semiconductor device in the present embodiment. FIG. 2 is a flowchart showing a method for manufacturing a SiC semiconductor device in the embodiment of the present invention. FIG. 3 to FIG. 8 are cross sectional views schematically illustrating steps in manufacturing the SiC semiconductor device in the embodiment of the present invention. FIG. 9 is a cross sectional view schematically showing the SiC semiconductor device manufactured in the embodiment of the present invention. In the present embodiment, the following describes a method for manufacturing a MOSFET 101 shown in FIG. 9 as the SiC semiconductor device, using manufacturing device 10 shown in FIG. 1 for manufacturing the SiC semiconductor device.

Figure 3:
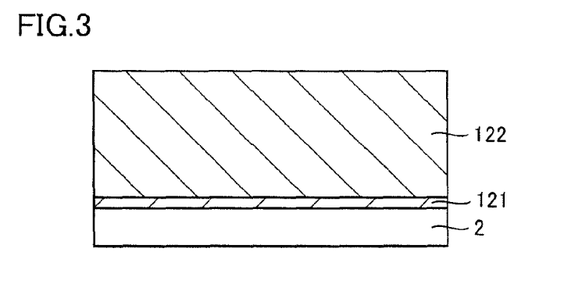
FIG. 3 is a cross sectional view schematically showing a step in manufacturing the SiC semiconductor device in the embodiment of the present invention.

First, as shown in FIG. 2 and FIG. 3, a SiC substrate 2 is prepared (step S1). SiC substrate 2 is not particularly limited, and can be prepared using the following method, for example.

Specifically, for example, a SiC ingot is prepared which has been grown by a sublimation method, a vapor phase epitaxy such as a CVD method, or a liquid phase epitaxy. Thereafter, the SiC ingot is cut to obtain a SiC substrate having a front-side surface. A method of cutting is not particularly limited. The SiC substrate is obtained by slicing the SiC ingot.

Next, the front-side surface of the SiC substrate thus obtained by the cutting is polished. Only the front-side surface thereof may be polished, or the front-side surface and the backside surface opposite to the front-side surface may be polished. A method of polishing is not particularly limited. For example, CMP (Chemical Mechanical Polishing) can be employed to planarize the front-side surface and reduce damages such as scratches. The CMP employs colloidal silica as a polishing agent and employs an adhesive agent or wax as a fixing agent. It should be noted that in addition to or instead of the CMP, another polishing may be performed such as an electropolishing method, a chemical polishing method, or a mechanical polishing method. Further, the polishing may not be performed.

Thereafter, the surface of the SiC substrate is cleaned. A method of cleaning is not particularly limited. For example, for the cleaning, an oxide film may be formed by means of thermal oxidation or the like and the oxide film may be removed by means of thermal decomposition, thermal etching, or the like. It should be noted that the cleaning of the SiC substrate may not be performed.

In this way, SiC substrate 2 shown in FIG. 3 can be prepared. As such a SiC substrate 2, a substrate may be employed which has n type conductivity and has a resistance of 0.02 Ωcm.

Next, as shown in FIG. 2 and FIG. 3, an epitaxial layer is formed on SiC substrate 2 by means of the vapor phase epitaxy, the liquid phase epitaxy, or the like (step S2). In the present embodiment, for example, the epitaxial layer is formed as follows.

First, as shown in FIG. 3, a buffer layer 121 is formed on SiC substrate 2. Buffer layer 121 is an epitaxial layer made of SiC of n type conductivity and having a thickness of 0.5 μm, for example. Further, buffer layer 121 contains an impurity of n type conductivity at a concentration of, for example, $5 \times 10^{17}$ $cm^{-3}$. Thereafter, a drift layer 122 is formed on buffer layer 121. As drift layer 122, a layer made of SiC having n type conductivity is formed by means of the vapor phase epitaxy, the liquid phase epitaxy, or the like. Drift layer 122 has a thickness of, for example, 10 μm. Further, drift layer 122 contains an impurity of n type conductivity at a concentration of, for example, $5 \times 10^{15}$ $cm^{-3}$.

Figure 4:
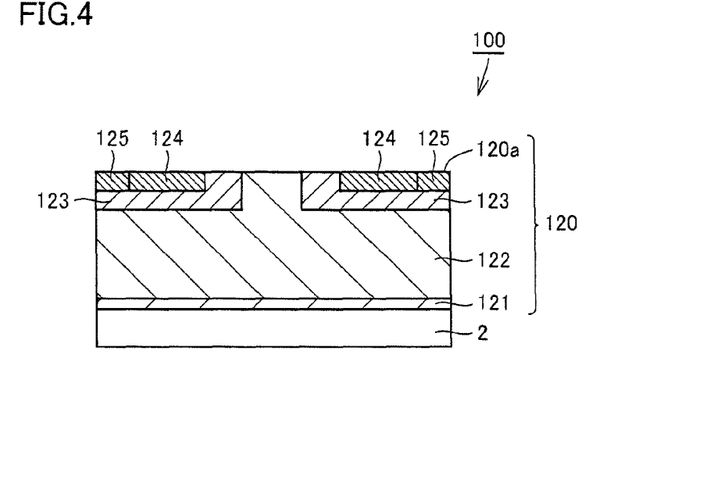
FIG. 4 is a cross sectional view schematically showing a step in manufacturing the SiC semiconductor device in the embodiment of the present invention.

Next, impurities are implanted into the epitaxial layer (step S3). In the present embodiment, p body regions 123, $n^+$ source regions 124, and $p^+$ region 125 shown in FIG. 4 are formed as follows. First, an impurity of p type conductivity is selectively implanted into portions of drift layer 122, thereby forming body regions 123. Then, an impurity of n type conductivity is selectively implanted into predetermined regions to form source regions 124, and an impurity of p type conductivity is selectively implanted into predetermined regions to form $p^+$ regions 125. It should be noted that such selective implantation of each of the conductive impurities is performed using a mask formed of, for example, an oxide film, which will be removed after the implantation.

In the above-described ion implantation step (step S3), each of implantation profiles is determined in consideration of a thickness to be removed by cleaning in a below-described step S4. In other words, the ion implantation is controlled to achieve desired arrangement of the above-described impurity diffusion regions when the first surface of the epitaxial layer is removed in step S4 of cleaning.

After step S3 of performing the ion implantation, activation annealing treatment may be performed. For example, the annealing is performed in argon atmosphere at a heating temperature of 1700° C. for 30 minutes.

As a results of the steps (steps S1-S3), epitaxial wafer 100 is prepared which includes SiC substrate 2 and epitaxial layer 120 formed on SiC substrate 2 and including first surface 120a having at least a portion in which the impurities are implanted, as shown in FIG. 4. In the present embodiment, first surface 120a of epitaxial layer 120 has regions different in at least one of the types of impurities and the concentrations thereof.

Figure 5:
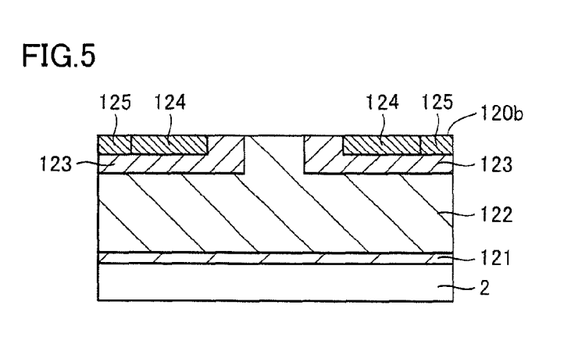
FIG. 5 is a cross sectional view schematically showing a step in manufacturing the SiC semiconductor device in the embodiment of the present invention.

Next, as shown in FIG. 2, FIG. 4, and FIG. 5, second surface 120b is formed by cleaning first surface 120a of epitaxial wafer 100 (step S4). A method of cleaning is not particularly limited. For example, there can be employed a method of performing dry etching (H etching) using a gas containing hydrogen gas, a method of forming an oxide film and then removing the oxide film, or the like. It is preferable to employ the H etching.

In the cleaning employing the H etching, first surface 120a of epitaxial layer 120 is dry-etched by the hydrogen gas, thereby removing first surface 120a together with impurities and particles adhered to first surface 120a. In epitaxial wafer 100, the removal of first surface 120a leads to formation of clean second surface 120b shown in FIG. 5.

It is preferable to perform the H etching in a temperature range of not less than 1300° C. and not more than 1650° C. By performing the H etching at a temperature equal to or greater than 1300° C., the etching rate can be increased. By performing the H etching at a temperature equal to or smaller than 1650° C., the etching rate can be suppressed from being too high. In this way, an amount of etching can be readily controlled. Hence, by adjusting the temperature condition of the H etching in a range of not less than 1300° C. and not more than 1650° C., the etching rate can be controlled at a suitable etching rate. Accordingly, first surface 120a can be H-etched with higher precision, which leads to more improved quality of MOSET 101 (see FIG. 9) to be manufactured and serving as the SiC semiconductor device. Such a temperature setting can be attained by, for example, heating epitaxial wafer 100 placed in the H etching device to fall within a range of not less than 1300° C. and not more than 1650° C.; introducing, into cleaning unit 11 of manufacturing device 10, a gas for etching (hereinafter, also referred to as "etching gas") at not less than 1300° C. and not more than 1650° C.; or maintaining the internal portion of cleaning unit 11 of manufacturing device 10 at not less than 1300° C. and not more than 1650° C. It should be noted that these may be combined.

Further, a flow rate of the hydrogen gas during the H etching is not particularly limited, but may be approximately several hundred slm (standard liter per minute). A pressure during the H etching is preferably approximately several ten hPa to approximately several hundred hPa. In this case, the H etching can be performed at a preferable speed.

Further, as the etching gas, only hydrogen gas may be used or a mixed gas of hydrogen gas and another gas may be used. In particular, it is preferable to use a mixed gas of hydrogen gas and hydrogen chloride (HCl) gas. The use of such a mixed gas can lead to increased etching rate. When the content of the hydrogen chloride gas in the mixed gas is too high, the etching rate becomes too large, which makes it difficult to control the etching. Hence, the content of the hydrogen chloride gas in the mixed gas is preferably equal to or smaller than 10%. More preferably, the content of the hydrogen chloride gas in the mixed gas including the hydrogen chloride gas and the hydrogen gas (hydrogen chloride gas/(hydrogen chloride gas+hydrogen gas)×100) is equal to or smaller than 10%.

Further, a mixed gas of hydrogen gas and hydrocarbon gas may be used. The use of such a mixed gas provides good surface morphology of epitaxial wafer 100 in the etching, thus forming second surface 120b having a good surface condition. As the hydrocarbon, a low-grade hydrocarbon such as alkane or alkene can be used. For example, acetylene ($C_2H_2$) or propane ($C_3H_8$) can be used therefor. Such a hydrocarbon gas is preferably mixed at 1000 ppm or smaller to effectively exhibit an effect of restraining generation of droplets of Si. Further, a mixed gas of hydrogen gas, hydrogen chloride gas, and hydrocarbon gas may be used as the etching gas.

When performing the H etching, manufacturing device 10 shown in FIG. 1 can be employed to perform step S5 of forming a below-described Si-containing film 128 without washing that uses a liquid phase after the step (step S4) of forming second surface 120b. Accordingly, adhesion of impurities (in particular, heavy metal ions and alkali ions) resulting from the washing that uses a liquid phase can be restrained. It should be noted that the washing that uses a liquid phase refers to washing the epitaxial wafer, which serves as the SiC semiconductor, in a liquid phase, and it may contain an unintended vapor phase component.

In the method of forming an oxide film and then removing the oxide film, an oxide film is formed on first surface 120a to absorb therein impurities, particles, and the like adhered to first surface 120a, and then this oxide film is removed, thereby removing the impurities, particles, and the like adhered to first surface 120a. In this way, clean second surface 120b can be formed.

The method of oxidizing first surface 120a is not particularly limited, but may be utilization of a solution containing O, utilization of thermal oxidation in an atmosphere containing O gas, utilization of O plasma, or the like, for example.

The solution containing O is intended to mean a solution containing oxygen (O), such as ozone water. Because SiC is a stable compound, it is preferable to use ozone water having a concentration of 30 ppm or greater, for example. In this case, decomposition of ozone can be restrained and speed of reaction between first surface 120a of epitaxial wafer 100 and ozone can be increased, thereby readily forming an oxide film on first surface 120a.

Further, the O gas refers to a gas containing oxygen. Because SiC is a stable compound, it is preferable to perform thermal oxidation in a dry atmosphere containing such O gas, at a temperature of 700° C. or greater, for example. It should be noted that the dry atmosphere is intended to indicate one allowing an oxide film to be formed in a gaseous phase, and it may contain an unintended liquid phase component.

Further, the O plasma refers to plasma generated from a gas containing oxygen, and can be generated by, for example, supplying oxygen gas ($O_2$) to a plasma generating device. The phrase "oxide film is formed using O plasma" is intended to indicate that an oxide film is formed using plasma resulting from a gas containing oxygen. In other words, it is intended to indicate that an oxide film is formed through a process that uses the plasma generated from the gas containing oxygen.

The method of removing the oxide film thus formed on first surface 120a is not particularly limited, but may employ wet etching, dry etching, thermal decomposition, F plasma, and the like, for example.

The wet etching uses a solution of, for example, HF, $NH_4F$ (ammonium fluoride), or the like so as to remove the oxide film.

The dry etching preferably uses at least one of hydrogen gas and hydrogen chloride gas at not less than 1000° C. and not more than the sublimation temperature of SiC, so as to remove the oxide film. The hydrogen gas and hydrogen chloride gas at 1000° C. or higher provide an effect of highly reducing the oxide film. In the case where the oxide film is made of $SiO_x$, the hydrogen gas decomposes $SiO_x$ into $H_2O$ and $SiH_y$, and the hydrogen chloride gas decomposes $SiO_x$ into $H_2O$ and $SiCl_z$. With the temperature being not more than the sublimation temperature of SiC, epitaxial wafer 100 can be restrained from being deteriorated. Further, it is preferable to perform the dry etching under a reduced pressure in order to facilitate the reaction.

The thermal decomposition of the oxide film is preferably performed in an atmosphere not containing oxygen, at a temperature of not less than 1200° C. and not more than the sublimation temperature of SiC. When heating the oxide film formed on first surface 120a of epitaxial wafer 100 in the atmosphere containing oxygen at 1200° C. or greater, the oxide film can be thermally decomposed readily. With the temperature being not more than the sublimation temperature of SiC, epitaxial wafer 100 can be restrained from being deteriorated. Further, it is preferable to perform the thermal decomposition under a reduced pressure in order to facilitate the reaction.

The F plasma refers to plasma generated from a gas containing fluorine (F), and can be generated by supplying a plasma generating device with a single gas or a mixed gas of carbon tetrafluoride gas ($CF_4$), trifluoromethane gas ($CHF_3$), chlorofluocarbon gas ($C_2F_6$), sulfur hexafluoride gas ($SF_6$), nitrogen trifluoride gas ($NF_3$), xenon difluoride gas ($XeF_2$), fluorine gas ($F_2$), and chlorine trifluoride gas ($ClF_3$). The phrase "removing the oxide film by means of F plasma" refers to removing the oxide film by means of plasma using a gas containing fluorine. In other words, it is intended to indicate that the oxide film is removed by means of the process that uses the plasma generated from the gas containing fluorine.

In this step S4, in order to remove the impurities and particles adhered to first surface 120a, the etching depth (amount of etching in a direction from first surface 120a toward SiC substrate 2) in the case of cleaning that employs the H etching, and the thickness (thickness in the direction from first surface 120a toward SiC substrate 2) of the oxide film formed in the case of cleaning that employs the formation and removal of the oxide film are, for example, not less than one molecular layer and not more than 10 nm. In this way, the impurities, particles, and the like adhered to first surface 120a are removed, thereby forming clean second surface 120b.

If first surface 120a is damaged due to ion implantation or activation annealing treatment for epitaxial wafer 100, it is preferable to remove the damage layer formed on first surface 120a. In order to attain this, the etching depth in the case of the cleaning that employs the H etching, and the thickness of the oxide film (sacrificial oxide film) in the case of the cleaning that employs the formation (sacrificial oxide film forming step) and removal (sacrificial oxide film removing step) of the oxide film are, for example, greater than 10 nm and equal to or smaller than 500 nm. In this way, the rough region can be removed while removing the impurities, particles, and the like adhered to first surface 120a, thereby forming second surface 120b excellent in surface characteristics.

Next, referring to FIG. 1, epitaxial wafer 100 thus provided with second surface 120b formed by cleaning unit 11 is transported to first forming unit 12. On this occasion, epitaxial wafer 100 is transported within first connection portion 14 which has atmosphere isolated from atmospheric air. In other words, between step S4 of forming second surface 120b and step S5 of forming Si-containing film 128, epitaxial wafer 100 is in the atmosphere isolated from the atmospheric air. In this way, impurities in the atmospheric air can be prevented from being adhered to clean second surface 120b after the formation of second surface 120b.

Figure 6:
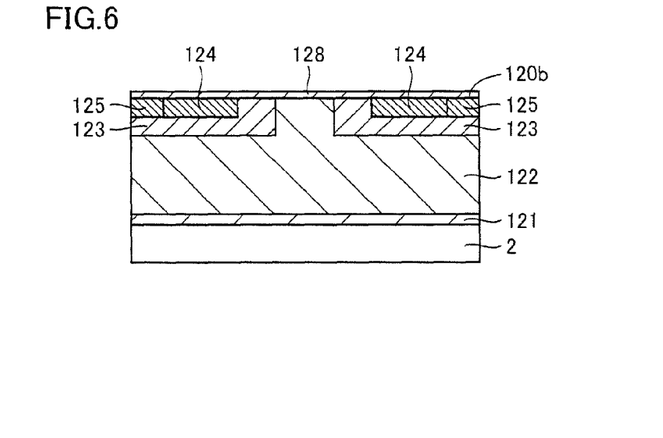
FIG. 6 is a cross sectional view schematically showing a step in manufacturing the SiC semiconductor device in the embodiment of the present invention.

Next, as shown in FIG. 2 and FIG. 6, Si-containing film 128 is formed on clean second surface 120b of epitaxial wafer 100 (step S5). Because second surface 120b is clean, a degree of cleanliness of film 128 to be formed thereon can be improved. Further, film 128 formed on second surface 120b can reduce influences of the types and concentrations of the impurities formed in second surface 120b. Hence, film 128 thus formed attains improved uniformity of quality.

A method of forming Si-containing film 128 on second surface 120b is not particularly limited. For example, a known epitaxy method can be used. The CVD method is preferably used. In the CVD method, film 128 is deposited from above onto second surface 120b, thereby reducing the influences of doping states in underlying second surface 120b of epitaxial wafer 100, such as the types, concentrations, and the like of the impurities therein.

In this step S5, it is preferable to form a Si film or a SiC film as film 128. The Si film contains Si as its main component and contains an inevitable impurity as its remaining component, for example. The SiC film contains SiC as its main component and contains an inevitable impurity as its remaining component, for example. In the case where the Si film is formed as film 128, C can be restrained from existing in an interface between epitaxial wafer 100 and gate oxide film 126 and in gate oxide film 126. This leads to improved quality of MOSFET 101 (FIG. 9) to be manufactured. In the case where film 128 is made of SiC, film 128 has the same crystal as that of underlying epitaxial layer 120 (i.e., epitaxial layer 120 and film 128 have the same lattice constant). This facilitates formation of film 128.

In this step S5, it is preferable to determine the thickness of gate oxide film 126 (see FIG. 7) to be formed in a below-described step S6 and to control the thickness of film 128 to be the determined thickness of gate oxide film 126 when film 128 is oxidized entirely (without oxidizing epitaxial layer 120 disposed below film 128). In other words, the thickness of film 128 is preferably determined in accordance with the thickness of gate oxide film 126 to be formed by entirely oxidizing film 128. This can be implemented by controlling the thickness of film 128 by means of calculation or the like in consideration of increased film thickness resulting from absorption of oxygen when oxidizing film 128 into gate oxide film 126.

The thickness of film 128 is, for example, approximately 0.44 times as large as the thickness of gate oxide film 126 (see FIG. 7) to be formed, in the case where film 128 is a Si film. In other words, in this step S5, a Si film serving as film 128 is formed to have a thickness 0.44 times as large as the thickness of gate oxide film 126 to be formed in step S6. By designing film 128 to have such a thickness, gate oxide film 126 will be able to have its thickness as designed even when the film thickness of film 128 is increased due to absorption of oxygen when film 128 is oxidized into the gate oxide film.

Next, referring to FIG. 1, epitaxial wafer 100 thus provided with Si-containing film 128 formed by first forming unit 12 is transported to second forming unit 13. On this occasion, epitaxial wafer 100 is transported within second connection portion 15 which has atmosphere isolated from atmospheric air. In other words, between step S5 of forming Si-containing film 128 and step S6 of forming gate insulating film 126, epitaxial wafer 100 is in the atmosphere isolated from the atmospheric air. In this way, impurities in the atmospheric air can be prevented from being adhered to film 128.

As shown in FIG. 2 and FIG. 7, gate oxide film 126 serving as the oxide film constituting the SiC semiconductor device is formed by oxidizing film 128 (step S6). Gate oxide film 126 is made of silicon oxide ($SiO_x$).

A method of oxidizing film 128 is not particularly limited, but is performed in, for example, an oxygen-containing atmosphere such as dry oxidation or wet oxidation. The dry oxidation is preferable. Conditions for the dry oxidation are, for example, as follows: the heating temperature is 1200° C. and the heating time is 30 minutes. Such oxidation can be done by introducing it into an oxidation furnace after step S5 of forming film 128 and by adjusting the heating temperature and heating time, for example.

In this step S6, it is preferable to form gate oxide film 126 by entirely oxidizing film 128 formed in step S5. In this way, remaining film 128 can be reduced. Further, in step S6, gate oxide film 126 is preferably formed in such a manner that only film 128 formed in step S5 is oxidized (without oxidizing epitaxial wafer 100). In this case, gate oxide film 126 can be formed so as not to include the impurities introduced into epitaxial wafer 100 by the ion implantation in step S3. This leads to improved quality of gate oxide film 126. This also leads to reduced influence over the ion implantation profiles of epitaxial layer 120.

Next, as shown in FIG. 2, gate oxide film 126 is subjected to annealing treatment (step S7). In this step S7, for example, gate oxide film 126 can be subjected to at least one of nitriding treatment and inert gas annealing treatment.

In the nitriding treatment, heat treatment is performed in an atmosphere containing nitrogen. As the nitriding treatment, for example, annealing is performed in a nitrogen monoxide (NO) atmosphere or a dinitride oxygen ($N_2O$) atmosphere at a heating temperature of 1200° C. for 120 minutes. In this way, a high-concentration nitrogen region (not shown) is formed at a region including the interface between epitaxial layer 120 and gate oxide film 126, so as to have a nitrogen concentration greater than that of a region adjacent to this high-concentration nitrogen region.

In the inert gas annealing treatment, heat treatment is performed in an atmosphere containing inert gas. As the inert gas annealing treatment, for example, annealing can be performed in an inert gas atmosphere such as argon (Ar) at a heating temperature of 1100° C. for 60 minutes.

In the case where the above-described nitriding treatment and inert gas annealing treatment are performed, high channel mobility can be reproduced more highly in MOSFETs 101. It should be noted that either one of the nitriding treatment and the inert gas annealing treatment may be performed or step S7 may not be performed. In the case where the nitriding treatment and the inert gas annealing treatment are performed, it is preferable to perforin the inert gas annealing treatment after the nitriding treatment.

After the annealing treatment (step S7), surface cleaning may be performed, such as organic cleaning, acid cleaning, or RCA cleaning.

Next, as shown in FIG. 2, FIG. 8, and FIG. 9, electrodes are formed on the epitaxial wafer having gate oxide film 126 formed thereon (step S8).

Specifically, first, source electrodes 111 shown in FIG. 8 are formed as follows. Specifically, a resist film having a pattern is formed on gate oxide film 126 using a photolithography method. Using the resist film as a mask, portions above $n^+$ regions 124 and $p^+$ regions 125 in gate oxide film 126 are removed by etching. In this way, openings are formed in gate oxide film 126. Next, in each of the openings, a conductive film is formed in contact with each of $n^+$ regions 124 and $p^+$ regions 125 by means of the deposition method, for example. Then, the resist film is removed, thus removing (lifting off) the conductive film's portions located on the resist film. This conductive film may be a metal film, for example, may be made of nickel (Ni). As a result of the lift-off, source electrodes 111 are formed.

It should be noted that on this occasion, heat treatment for alloying is preferably performed. For example, the heat treatment is performed in an atmosphere of argon (Ar) gas, which is an inert gas, at a heating temperature of 950° C. for two minutes.

Thereafter, as shown in FIG. 9, for example, upper source electrodes 127 are formed on source electrodes 111 by means of the deposition method. Further, for example, drain electrode 112 is formed on the backside surface of SiC substrate 2 by means of the deposition method.

Further, gate electrode 110 is formed, for example, as follows. That is, a resist film having an opening pattern is formed in advance at a region on gate oxide film 126, and is then used to form a conductive film so as to cover the resist film entirely and constitute the gate electrode. Then, the resist film is removed, thereby removing (lifting off) portions of the conductive film other than its portion to serve as the gate electrode. As a result, as shown in FIG. 9, gate electrode 110 can be formed on gate oxide film 126.

When required, additional steps may be performed after step S3, such as a wet cleaning step employing a chemical solution, a pure water rinsing step, a drying step, and the like. An exemplary chemical solution is a SPM containing sulfuric acid and hydrogen peroxide water. In the case of cleaning with the SPM before step S4, organic substances can be removed. Further, RCA cleaning or the like may be performed before step S4.

As described above, the method for manufacturing MOSFET 101 serving as one exemplary SiC semiconductor device in the present embodiment includes: the step (steps S1-S3) of preparing epitaxial wafer 100 that includes first surface 120a having at least a portion in which an impurity is implanted and that serves as a SiC semiconductor; the step (step S4) of forming second surface 120b by cleaning first surface 120a of epitaxial wafer 100; and the step (step S5) of forming Si-containing film 128 on second surface 120b; and the step (step S7) of forming gate oxide film 126 as the oxide film constituting MOSFET 101 serving as the SiC semiconductor device, by oxidizing Si-containing film 128.

According to the method for manufacturing MOSFET 101 in the present embodiment, Si-containing film 128 is formed on second surface 120b of epitaxial wafer 100. Accordingly, even when second surface 120b has regions different in doping concentrations and having different types of dopants, influence of second surface 120b can be reduced over the film quality of Si-containing film 128. In other words, the quality of film 128 is less dependent on second surface 120b even when the state of second surface 120b is not uniform due to presence/absence of implanted ions and the doping amounts and types of the impurities. This leads to improved uniformity of the film quality of Si-containing film 128. When Si-containing film 128 thus having the improved uniformity of the film quality is oxidized, variation in oxidizing rate in the depth direction and variation in film quality can be reduced in each location within Si-containing film 128. Namely, the manufacturing method of the present embodiment can provide reduced difference between a region likely to be oxidized and a region less likely to be oxidized, as compared with the case where no Si-containing film 128 is formed and second surface 120b of epitaxial wafer 100 is therefore directly subjected to thermal oxidation. In this way, the quality of gate oxide film 126 can be improved.

Further, because Si-containing film 128 is formed on second surface 120b formed by cleaning first surface 120a of epitaxial wafer 100, cleanliness of film 128 can be improved. This leads to improved cleanliness of gate oxide film 126 to be formed from film 128. In particular, this leads to reduced impurities, particles, and the like at the interface between epitaxial wafer 100 and gate oxide film 126. Further, the impurities, particles, and the like in gate oxide film 126 can be reduced, thereby improving the film quality of gate oxide film 126. Accordingly, MOSFET 102 having such a gate oxide film 126 attains improved breakdown voltage when applying a reverse voltage, and attains improved stability and long-term reliability of operations when applying a forward voltage.

Thus, by oxidizing such a uniform Si-containing film 128 formed on clean second surface 120b, gate oxide film 126 can be formed to have uniform film quality with cleanliness. Accordingly, MOSFET 101 achieving improved performance can be manufactured.

In the method for manufacturing MOSFET 101 serving as one exemplary SiC semiconductor device in the present embodiment, dry etching is preferably performed in step S4 of cleaning, using a gas containing hydrogen gas.

In step S4, first surface 120a of epitaxial wafer 100 is H-etched, thereby removing first surface 120a. The impurities, particles, and the like adhered to first surface 120a are removed together with first surface 120a, thereby forming second surface 120b with improved cleanliness. Further, even though the H etching, which causes damage on Si, is employed, epitaxial wafer 100 is less damaged because SiC is a stable compound. Hence, second surface 120b having good surface characteristics can be formed. Accordingly, a SiC semiconductor device having more improved quality can be manufactured.

In the method for manufacturing MOSFET 101 serving as one exemplary SiC semiconductor device in the present embodiment, the H etching is performed in the step of cleaning (step S4), and the step of forming film 128 (step S5) is performed without washing that uses a liquid phase after the step (step S4) of forming second surface 120b.

The present inventors have diligently conducted studies and accordingly have found that when epitaxial wafer 100 is washed using a liquid phase, the cleaning for epitaxial wafer 100 is not only insufficient but also provides epitaxial wafer 100 with impurities resulting from the liquid phase. In view of this, film 128 is formed without washing that uses a liquid phase after the formation of second surface 120b, thereby preventing adhesion of the impurities resulting from the washing that uses a liquid phase, such as alkali ions and heavy metal ions. By reducing the alkali ions, heavy metal ions, and the like, MOSFET 101 with higher quality can be manufactured.

Further, in the case where a liquid phase is used in the sacrificial oxidation and sacrificial oxide film removing step disclosed in Patent Literature 1 described above, time required for the cleaning is approximately 15 hours. In contrast, in the H etching involving no washing that uses a liquid phase, first surface 120a of epitaxial wafer 100 can be cleaned for approximately 4 hours. Thus, the time required in manufacturing the SiC semiconductor device can be reduced by performing no washing that uses a liquid phase and no sacrificial oxidation and sacrificial oxide film removal between the cleaning that uses the H etching (step S2) and the formation of film 128 (step S5) in the method for manufacturing the SiC semiconductor device according to the present embodiment.

It should be noted that the phrase "performing the step (step S5) of forming Si-containing film 128 after the step (step S4) of forming second surface 120b, without washing that uses a liquid phase" indicates that no washing that uses a liquid phase is involved between step S4 and step S5. Step S4 and step S5 may be performed intermittently (there may be passage of time between step S4 and S5). Alternatively, step S4 and step S5 may be performed continuously.

In the present embodiment, the method for manufacturing the MOSFET serving as the SiC semiconductor device has been exemplified and illustrated. However, the present invention is applicable to a method for manufacturing a SiC semiconductor device configured to include an oxide film obtained by cleaning a SiC epitaxial wafer including a first surface 120a having at least a portion to which an impurity is implanted, so as to clean first surface 120a to obtain a second surface 120b; forming a Si-containing film 128 on second surface 120b; and oxidizing film 128 (a SiC semiconductor device including the remaining oxide film). The present invention is generally applicable to SiC semiconductor devices each having an insulated gate type electric field effect portion such as a MOSFET or an IGBT (Insulated Gate Bipolar Transistor), as well as SiC semiconductor devices each including an oxide film, such as a JFET (Junction Field-Effect Transistor).

Example

Figure 10:
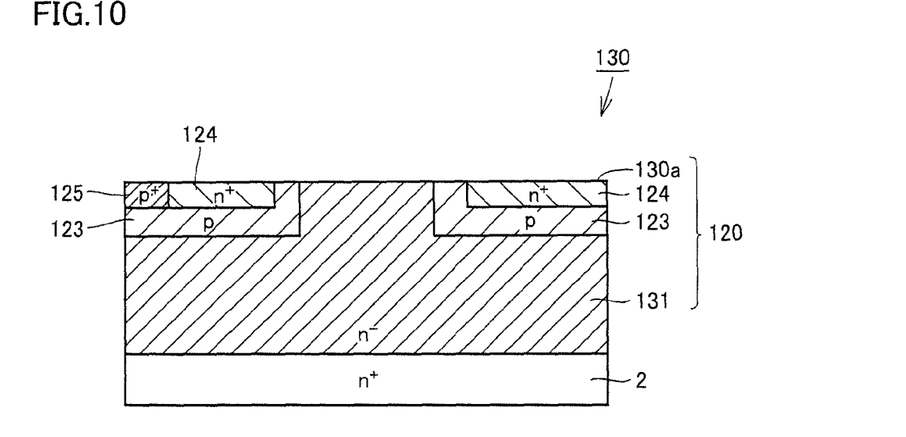
FIG. 10 is a cross sectional view schematically showing an epitaxial wafer used in an example.

In the present example, as a SiC semiconductor, an epitaxial wafer 130 shown in FIG. 10 was used to examine the effect provided by the cleaning that uses the H etching to first surface 130a of epitaxial wafer 130. FIG. 10 is a cross sectional view schematically showing an epitaxial wafer used in each of samples 1 to 3 in the example.

(Sample 1)

Specifically, first, a 4H—SiC substrate was prepared as SiC substrate 2 (step S1). Next, as a layer constituting epitaxial layer 120, an n type SiC layer 131 was grown by means of the CVD method to have a thickness of 10 μm and an impurity concentration of $1\times10^{16}$ cm$^{-3}$ (step S2).

Next, using SiO$_2$ as a mask, p body regions 123 were formed to contain aluminum (Al) as a p type impurity at a conductive impurity concentration of $2\times10^{16}$ cm$^{-3}$. In addition, n$^+$ source regions 124 were formed to contain phosphorus (P) as an n type impurity at a conductive impurity concentration of $1\times10^{19}$ cm$^{-3}$. Further, a p$^+$ region 125 was formed to contain Al as a p type impurity at a conductive impurity concentration of $1\times10^{19}$ cm$^{-3}$ (step S3). It should be noted that after each ion implantation, the mask was removed.

Next, activation annealing treatment was performed. This activation annealing treatment was performed under conditions that Ar gas (Ar$_2$) was used as an atmospheric gas, heating temperature was 1700° C.-1800° C., and heating time was 30 minutes. In this way, an epitaxial wafer 130 was prepared which had first surface 130a having at least a portion in which the impurities were implanted.

Next, first surface 130a of epitaxial wafer 100 thus prepared was removed by means of H etching (step S4). Specifically, epitaxial wafer 130 was placed in a reactor and first surface 130a thereof was H-etched while heating epitaxial wafer 130 by a base on which epitaxial wafer 130 was placed and which was controlled at not less than 1300° C. and not more than 1650° C. The H etching was performed under conditions that hydrogen gas was introduced into the reactor at a flow rate of 50-200 slm, pressure in the reactor was 20-150 hPa, and reaction time was 1 hour.

(Sample 2)

A sample 2 was basically the same as sample 1, but was different therefrom in that the H etching of step S2 was not performed. In other words, in sample 2, epitaxial wafer 130 prepared by steps S1-3 was not cleaned.

(Sample 3)

Sample 3 was basically the same as sample 1 but was different therefrom in that first surface 130a of epitaxial wafer 130 was washed using liquid phases instead of the H etching in step S2. As the liquid phases, the following were employed: a mixed solution 1 containing sulfuric acid and hydrogen peroxide water at a volume ratio of 5:1; a mixed solution 2 containing aqueous ammonia, hydrogen peroxide water, and pure water at a volume ratio of 1:1:5; a mixed solution 3 containing hydrogen chloride (HCl), hydrogen peroxide (H$_2$O$_2$), and pure water at a volume ratio of 1:1:6; and a 10% hydrogen fluoride (HF) solution. Specifically, in sample 3, epitaxial wafer 130 prepared was chemically washed by soaking it in mixed solution 1 for 0.5 hour, soaking it in mixed solution 2 for 10 minutes, soaking it in the HF solution for 10 minutes, soaking it in mixed solution 3 for 10 minutes, soaking it in mixed solution 2 for 10 minutes, and soaking it in the HF solution for 10 minutes. It should be noted that epitaxial wafer 130 thus chemically washed was dried by blowing with Ar gas or N$_2$ gas using an Ar gun or a N$_2$ gun.

(Measurement of Impurities at Surface)

The surface of epitaxial wafer 130 of each of samples 1-3 was subjected to TXRF (total reflection fluorescent X-ray analysis). In the TXRF, W (tungsten)-Lβ rays were employed as an excitation source.

By means of the TXRF, impurities on the surface of epitaxial wafer 130 of each of samples 1-3 were measured. The surface of epitaxial wafer 130 having been through the H etching in sample 1 had reduced impurities as compared with those on the surface of sample 2 not having been through the H etching. Thus, it can be understood that a SiC semiconductor device with improved quality can be manufactured by forming a Si-containing film on epitaxial wafer 130 having been through the H etching, and oxidizing this film so as to form an oxide film constituting the SiC semiconductor device.

Further, it was found that the surface of epitaxial wafer 130 having been washed using the liquid phases in sample 3 had more impurities than those in sample 2. These results are shown in FIG. 11 and FIG. 12.

Figure 11:
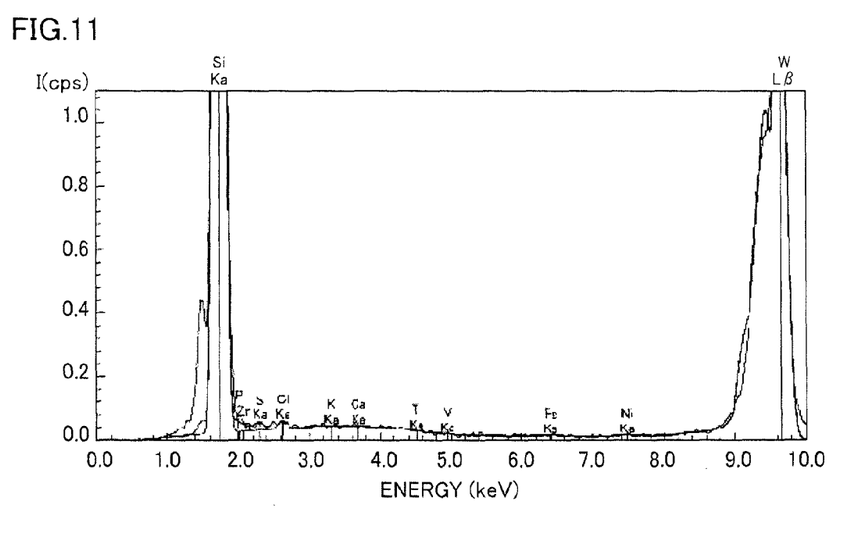
FIG. 11 is a spectrography showing a result of measuring a surface of an epitaxial wafer 130 of a sample 2 by means of TXRF.

FIG. 11 is a spectrography showing the result of measuring the surface of epitaxial wafer 130 of sample 2 by means of the TXRF. FIG. 12 is a spectrography showing the result of measuring the surface of epitaxial wafer 130 having been washed in sample 3, by means of the TXRF. In each of FIG. 11 and FIG. 12, the horizontal axis represents energy intensity and the vertical axis represents spectral intensity. As the height of a peak is higher, a larger amount of corresponding rays are detected. Further, for example, an indication "Cl, Kα" in FIG. 11 indicates that Cl-Kα-rays were detected. The same holds true for other indications. Further, a peak of energy intensity at approximately 9.67 eV is a peak of the W-Lβ rays serving as an excitation ray source.

Figure 12:
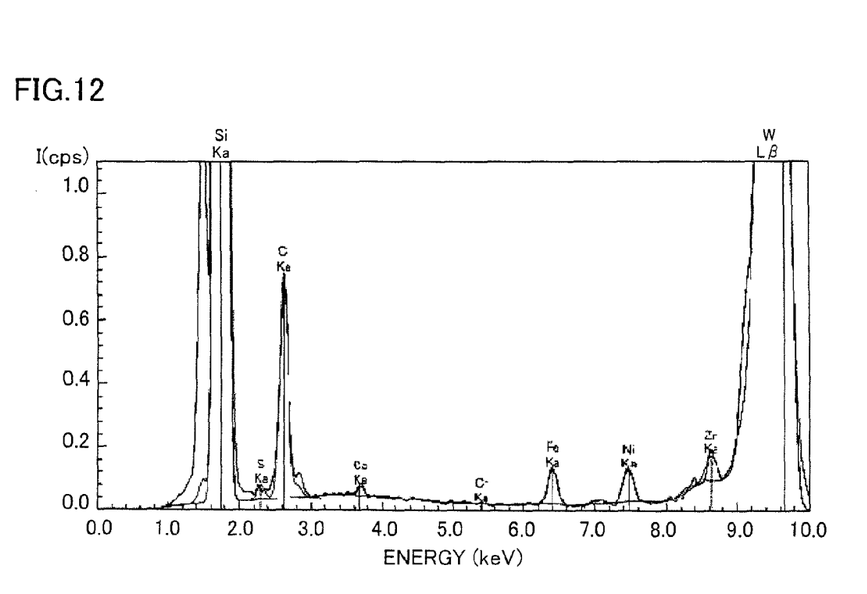
FIG. 12 is a spectrography showing a result of measuring a surface of an epitaxial wafer 130 having been washed in a sample 3, by means of the TXRF.

Comparing FIG. 11 with FIG. 12, only chlorine (Cl) was detected in sample 2, whereas Cl, calcium (Ca), nickel (Ni), and iron (Fe) were detected in sample 3. Thus, it was found that in the case where the surface of epitaxial wafer 130 is washed using a liquid phase, the surface is not cleaned and is given impurities adhered thereto.

Accordingly, it was found that a SiC semiconductor device with more improved quality can be manufactured when manufacturing a semiconductor device configured to include an oxide film obtained by forming a Si-containing film on epitaxial wafer 130 having been through the H etching in sample 1 without washing epitaxial wafer 130 with a liquid phase, and oxidizing the film.

Heretofore, the embodiments and examples of the present invention have been illustrated, but it has been initially expected to appropriately combine features of the embodiments and examples. The embodiments and examples disclosed herein are illustrative and non-restrictive in any respect. The scope of the present invention is defined by the terms of the claims, rather than the embodiments and examples described above, and is intended to include any modifications within the scope and meaning equivalent to the terms of the claims.

REFERENCE SIGNS LIST

2: SiC substrate; 10: manufacturing device; 11: cleaning unit; 12: first forming unit; 13: second forming unit; 14: first connection portion; 15: second connection portion; 100, 130: epitaxial wafer; 120a, 130a: first surface; 120b: second surface; 101: MOSFET; 110: gate electrode; 111, 127: source electrode; 112: drain electrode; 120: epitaxial layer; 121: buffer layer; 122: drift layer; 123: body region; 124: source region; 125: p$^+$ region; 126: gate oxide film; 128: film; 131: SiC layer.

The invention claimed is:

1. A method for manufacturing a silicon carbide semiconductor device, comprising the steps of:
preparing a silicon carbide semiconductor including a first surface having at least a portion into which an impurity is implanted;
forming a second surface thereof by cleaning said first surface of said silicon carbide semiconductor;
forming a silicon-containing film on said second surface; and forming a first oxide film constituting the silicon carbide semiconductor device, by oxidizing said silicon-containing film, wherein said first oxide film is a gate oxide film, said first surface being cleaned by means of at least one of a dry etching process employing a mixed gas of hydrogen gas and hydrogen chloride gas, which is contained in the mixed gas at a content (the hydrogen chloride gas/(the hydrogen chloride gas+the hydrogen gas)×100) of 10% or smaller, and a process for forming a second oxide film on said first surface using at least one of a solution containing oxygen, thermal oxidation in an atmosphere containing oxygen gas, and oxygen plasma, and then removing said second oxide film.

2. The method for manufacturing the silicon carbide semiconductor device according to claim 1, wherein said silicon-containing film is a silicon carbide film.

3. The method for manufacturing the silicon carbide semiconductor device according to claim 1, wherein said silicon-containing film is a silicon film.

4. The method for manufacturing the silicon carbide semiconductor device according to claim 1, wherein:
the step of forming said silicon-containing film includes the steps of
determining a thickness of said first oxide film constituting the silicon carbide semiconductor device, and
controlling a thickness of said silicon-containing film to be the determined thickness of said first oxide film when said silicon-containing film is entirely oxidized.

* * * * *